United States Patent
Horch et al.

(10) Patent No.: US 6,666,481 B1
(45) Date of Patent: Dec. 23, 2003

(54) SHUNT CONNECTION TO EMITTER

(75) Inventors: Andrew Horch, Sunnyvale, CA (US); Scott Robins, San Jose, CA (US)

(73) Assignee: T-Ram, Inc., San Jose, CA (US)

( * ) Notice: Subject to any disclaimer, the term of this patent is extended or adjusted under 35 U.S.C. 154(b) by 0 days.

(21) Appl. No.: 10/262,728

(22) Filed: Oct. 1, 2002

(51) Int. Cl.[7] ............... H01L 29/423; H01L 29/45; H01L 29/51
(52) U.S. Cl. ............... 287/133; 257/137; 257/146; 257/163
(58) Field of Search ............... 257/133, 137, 257/146, 163

(56) References Cited

U.S. PATENT DOCUMENTS

| | | | |
|---|---|---|---|
| 3,943,549 A | | 3/1976 | Jaecklin et al. |
| 4,165,517 A | | 8/1979 | Temple et al. |
| 4,281,336 A | | 7/1981 | Sommer et al. |
| 4,323,793 A | | 4/1982 | Schutten et al. |
| 4,646,121 A | | 2/1987 | Ogura |
| 4,825,272 A | * | 4/1989 | Lehmann ............ 257/121 |
| 4,829,357 A | | 5/1989 | Kasahara |
| 4,864,168 A | | 9/1989 | Kasahara et al. |
| 4,982,258 A | | 1/1991 | Baliga |
| 5,412,228 A | | 5/1995 | Baliga |
| 5,463,344 A | | 10/1995 | Temple |
| 5,606,186 A | * | 2/1997 | Noda ............ 257/226 |
| 6,104,045 A | | 8/2000 | Forbes et al. |
| 6,225,165 B1 | | 5/2001 | Noble, Jr. et al. |
| 6,229,161 B1 | | 5/2001 | Nemati et al. |

OTHER PUBLICATIONS

6/98, Nemati, Farid, and Plummer, James D., "A Novel High Density, Low Voltage SRAM Cell with a Vertical NDR Device", VLSI Technology Technical Digest.

1999, Nemati, Farid, and Plummer James, D., "A Novel Thyristor–based SRAM Cell (T–RAM) for High–Speed, Low–Voltage, Giga–scale Memories", International Electron Device Meeting Technical Digest.

Gribnikov, Z.S., Korobov, V.A., and Mitin, V.V., "The Tunnel Diode As A Thyristor Emitter", Solid–State Electronics, vol. 42, No. 9, pp. 1761–1763.

(List continued on next page.)

*Primary Examiner*—Ngăn V. Ngǒ

(57) ABSTRACT

A semiconductor device is formed having a thyristor, a pass device and a conductive shunt that electrically connects an emitter region of the thyristor with a node near an upper surface of the substrate. In one example embodiment of the present invention, the conductive shunt is formed in a trench in a substrate and extending from an upper surface of the substrate to an emitter region of a vertical thyristor, with the emitter region being in the substrate and below the upper surface. In one implementation, the thyristor includes a thyristor body and a control port, with an N+ emitter region of the thyristor body being in the substrate and below and upper surface thereof. A pass device is formed adjacent to the thyristor, and the conductive shunt is formed in a trench extending from the N+ emitter region to a source/drain region of the pass device. With this approach, thyristor applications can be implemented having an emitter region in a substrate and not necessarily directly accessible, for example, via an upper surface of the substrate. This approach is also useful, for example, in applications where a cathode-down thyristor is used, such as when it is desirable to form the thyristor control port near a bottom portion of the thyristor, and in high-density circuit applications, such as memory arrays.

21 Claims, 8 Drawing Sheets

OTHER PUBLICATIONS

K. DeMeyer, S. Kubicek and H. van Meer, *Raised Source/Drains with Disposable Spacers for sub 100 nm CMOS technologies,* Extended Abstracts of International Workshop on Junction Technology 2001.

Mark Rodder and D. Yeakley, *Raised Source/Drain MOSFET with Dual Sidewall Spacers,* IEEE Electron Device Letters, vol. 12, No. 3, Mar. 1991.

Yang–Kyu Choi, Daewon Ha, Tsu–Jae King and Chenming Hu, *Nanoscale Ultrathin Body PMOSFETs With Raised Selective Germanium Source/Drain,* IEEE Electron Device Letters, vol. 22, No. 9, Sep. 2001.

N. Lindert, Y.–K. Choi, L. Chang, E. Anderson, W.–C. Lee, T.–J. King, J. Bokor, and C. Hu, *Quasi–Planar FinFETs with Selectively Grown Germanium Raised Source/Drain,* 2001 IEEE International SOI Conference, 10/01.

T. Ohguro, H. Naruse, H. Sugaya, S. Nakamura, E. Morifuji, H. Kimijima, T. Yoshitomi, T. Morimoto, H.S. Momose, Y. Katsumata, and H. Iwai, *High Performance RF Characteristics of Raised Gate/Source/Drain CMOS with Co Salicide,* 1998 Symposium on VLSI Technology Digest of Technical Papers.

Hsiang–Jen Huang, Kun–Ming Chen, Tiao–Yuan Huang, Tien–Shen Chao, Guo–Wei Huang, Chao–Hsin Chien, and Chun–Yen Chang, *Improved Low Temperature Characteristics of P–Channel MOSFETs with $Si_{1-x}Ge_x$ Raised Source and Drain,* IEEE Transactions on Electron Devices, vol. 48, No. 8, Aug. 2001.

\* cited by examiner

US 6,666,481 B1

SHUNT CONNECTION TO EMITTER

RELATED PATENT DOCUMENTS

This patent document is related to U.S. patent application Ser. No. 10/262,792 (TRAM.017PA), entitled "Thyristor Control Port at Trench Bottom," to U.S. patent application Ser. No. 10/262,758 (TRAM.019PA), entitled "Varied Trench Depth for Thyristor Isolation," and to U.S. patent application Ser. No. 10/262,729 (TRAM.014PA), entitled "Trench Isolation for Thyristor-based Device," each of which are filed concurrently herewith and fully incorporated herein by reference.

FIELD OF THE INVENTION

The present invention is directed to semiconductor devices and, more specifically, to semiconductor devices including thyristors and implementations thereof including memory, current-switching applications and others.

BACKGROUND

An important part in the design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price), with DRAM cell size being typically between 6 $F^2$ and 8 $F^2$, where F is the minimum feature size. However, with typical DRAM access times of approximately 50 nSec, DRAM is relatively slow compared to typical microprocessor peeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density and is typically between about 60 $F^2$ and 100 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

A thin capacitively-coupled thyristor-type NDR device can be effective in overcoming many previously unresolved problems for thyristor-based applications. An important consideration in the design of the thin capacitively-coupled thyristor device involves designing the body of the thyristor sufficiently thin, so that the capacitive coupling between the control port and the thyristor base region can substantially modulate the potential of the base region. Another important consideration in semiconductor device design, including those employing thin capacitively-coupled thyristor-type devices, includes forming devices in applications where electrical connection needs to be made to portions of the device buried in a substrate. For instance, it may be advantageous to form a vertical thyristor having portions thereof buried in the substrate and to which electrical access is desirable.

These and other design considerations have presented challenges to efforts to implement such a thin capacitively-coupled thyristor in bulk substrate applications, and in particular in highly dense applications.

SUMMARY

The present invention is directed to overcoming the above-mentioned challenges and others related to the types of devices and applications discussed above, including memory cells, as well as in other circuits. The present invention is exemplified in a number of implementations and applications, some of which are summarized below.

According to an example embodiment of the present invention, a semiconductor device includes a thyristor (i.e., thyristor-based) having a buried emitter region in a substrate, and a current shunt in the substrate and coupled to the buried emitter region. The current shunt extends from the buried emitter region, through the substrate and to a node at the upper surface of the substrate. The thyristor includes a control port arranged for capacitively coupling to the thyristor for controlling current flow therein (e.g., wherein the control port is adapted for causing an outflow of minority carriers from a region of the thyristor in response to at least one voltage pulse applied thereto). With this approach, contact to a buried emitter region of the thyristor can be made, for example, via the node at the upper surface, addressing challenges including those discussed hereinabove.

In another example embodiment of the present invention, the control port is formed in a filled trench adjacent to the thyristor and lined with a dielectric, and the control port is capacitively coupled to the thyristor via the dielectric. In one approach, the control port is near a bottom portion of the filled trench; this approach has also been found to be useful in filling lower portions of the filled trench when the trench has a high height-to-width aspect ratio. In another implementation, the filled trench has a varied depth, with a relatively deeper portion thereof electrically insulating the buried emitter region from adjacent circuitry in the device. In yet another implementation, the semiconductor device includes a shallow trench isolation (STI) region in the substrate, with a relatively deeper portion of the filled trench being below the STI region. In still another implementation, the filled trench also includes the current shunt, with an insulative material electrically insulating the current shunt from the control port.

According to another example embodiment of the present invention, a semiconductor device includes a conductive shunt electrically connecting a buried emitter region of a thyristor with a pass device. The thyristor includes a body having the buried emitter region at a bottom portion of the thyristor that is buried below and upper surface of a substrate, and a control port adapted for capacitively coupling to the body for controlling current in the thyristor. The pass device is formed at the upper surface of the substrate, adjacent to the thyristor and having source/drain regions separated by a channel region in the substrate, with a gate capacitively coupled to the channel region. The conductive shunt is formed extending through a portion of the substrate and vertically between the emitter region and the first source/drain region, thus electrically connecting the pass device and the emitter region where the emitter region is buried in the substrate. Connecting to a buried emitter using this approach has also been found to be useful, for example, in memory and/or other applications wherein electrical access to a buried emitter region is desirable.

In a more particular example embodiment of the present invention, the conductive shunt is used to form the buried emitter region. The conductive shunt is doped with a dopant that is out-diffused from the conductive shunt into the substrate below and adjacent to the trench. The diffused dopant forms the emitter region of the thyristor, which is electrically connected to the conductive shunt. The conductive shunt is also electrically coupled to the first source/drain region, forming an electrical connection between the buried emitter region and the first source/drain region.

In another example embodiment of the present invention, a plurality of semiconductor devices including thyristors, such as those discussed above, are configured and arranged as a memory array adapted for read and write access. Each thyristor includes a buried emitter region adapted for storing data (e.g., a "one" or a "zero"). The data is stored as a function of the state of the thyristor, wherein the thyristor is latched in on or off states in response to voltage pulses applied to the control port and the pass device. Reading data from the buried emitter region is controlled via signals applied to the gate of the pass device. Electrical connection between the stored information at the emitter region and the pass device is made by the conductive shunt.

The above summary of the present invention is not intended to describe each illustrated embodiment or every implementation of the present invention. The Figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which:

FIGS. 1A–1D show a thyristor-based semiconductor device at various stages of manufacture, according to an example embodiment of the present invention, wherein FIG. 1A shows a trench formed for a thyristor-based semiconductor device;

FIG. 1B is the semiconductor device of FIG. 1A having a dielectric and control port formed in a portion of the trench;

FIG. 1C is the semiconductor device of FIG. 1B having a cathode shunt formed in a portion of the trench; and FIG. 1D is the semiconductor device of FIG. 1C having thyristor body regions and a pass device;

Figure 1A:
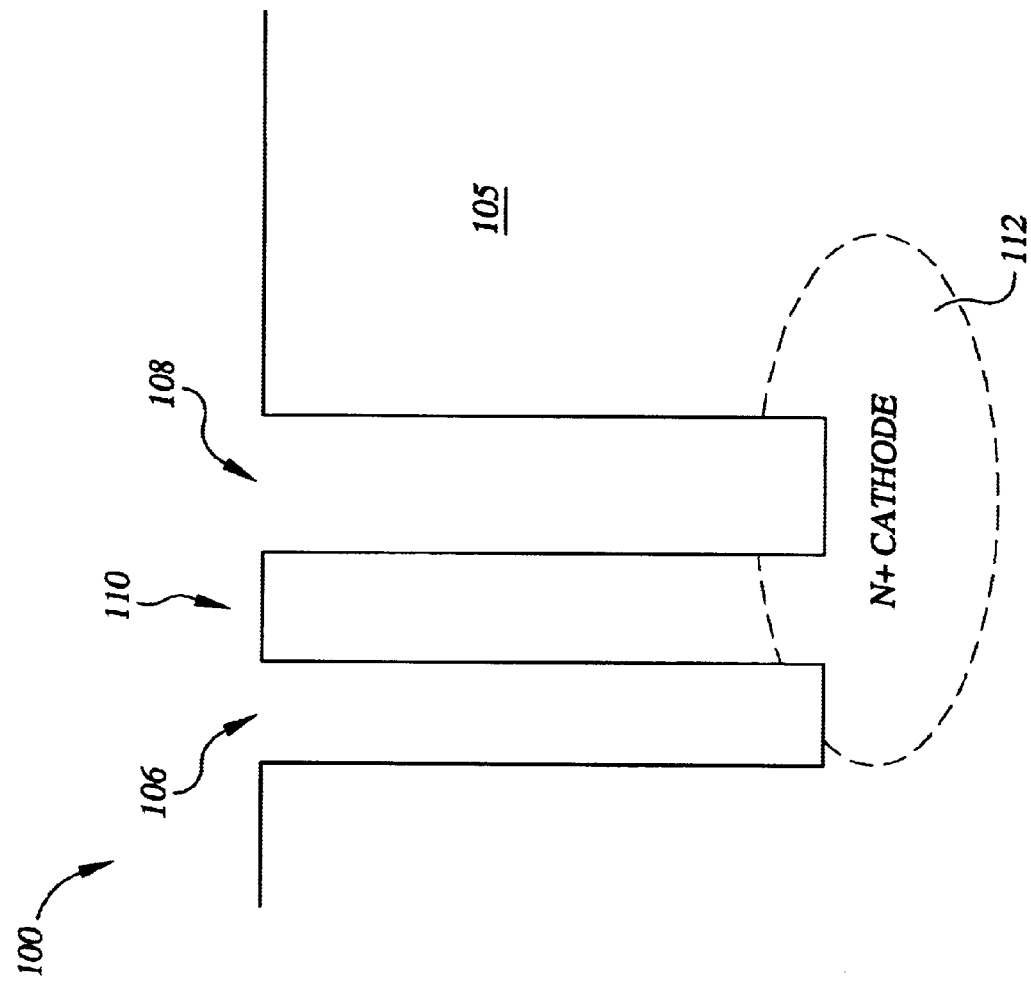

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor applications, and has also been found to be particularly useful for thyristor-based applications having an emitter region below an upper surface of a substrate. While the present invention is not necessarily limited to such applications, various aspects of the invention may be appreciated through a discussion of various examples using this context.

According to an example embodiment of the present invention, a semiconductor device is formed in a substrate and having a thyristor, a pass device and a conductive shunt electrically coupling a buried emitter region of the thyristor with the pass device. The thyristor includes a body region and a control port, the body region including the buried emitter region and the control port being adapted for capacitively coupling to the thyristor body and for controlling current therein. The pass device is formed adjacent to the thyristor and having source/drain regions in the substrate. A trench is etched in the substrate and extending between the buried emitter region and a source/drain region of the pass device, the trench is lined with an insulative material and the shunt is formed in the lined trench.

The buried emitter region is formed in a variety of manners, depending upon the application. In one implementation, a dopant is implanted via a bottom portion of the trench in which the conductive shunt is to be formed, prior to forming the shunt. In another implementation, material in the shunt is out-diffused into substrate adjacent to the shunt, doping the substrate and forming the emitter region. In either implementation, the dopant is selected for the particular application to which the device is to be applied. For instance, N+ dopant can be implanted or out-diffused into the emitter region to form a cathode emitter in a cathode-down thyristor device formed using a high aspect ratio trench. For more information regarding high aspect ratio trench applications to which the present invention is applicable, reference may be made to U.S. patent application Ser. No. 10/262,792 (TRAM.017PA), filed concurrently herewith and entitled "Thyristor Control Port at Trench Bottom," which is fully incorporated herein by reference.

FIGS. 1A through 1D show a thyristor-based semiconductor device 100 being manufactured having a shunt connection between a buried thyristor emitter and a pass device, according to a more particular example embodiment of the present invention. In FIG. 1A, a semiconductor substrate 105 is masked and trench regions 106 and 108 are etched in the substrate and adjacent to a thyristor body region 110. In one implementation, the trench regions 106 and 108 are regions of a single trench, and in another implementation, the trench regions are separate trenches. A portion of the substrate 105 below the trench region 108 is implanted to form a N+ cathode emitter region 112 of the thyristor.

Figure 1B:
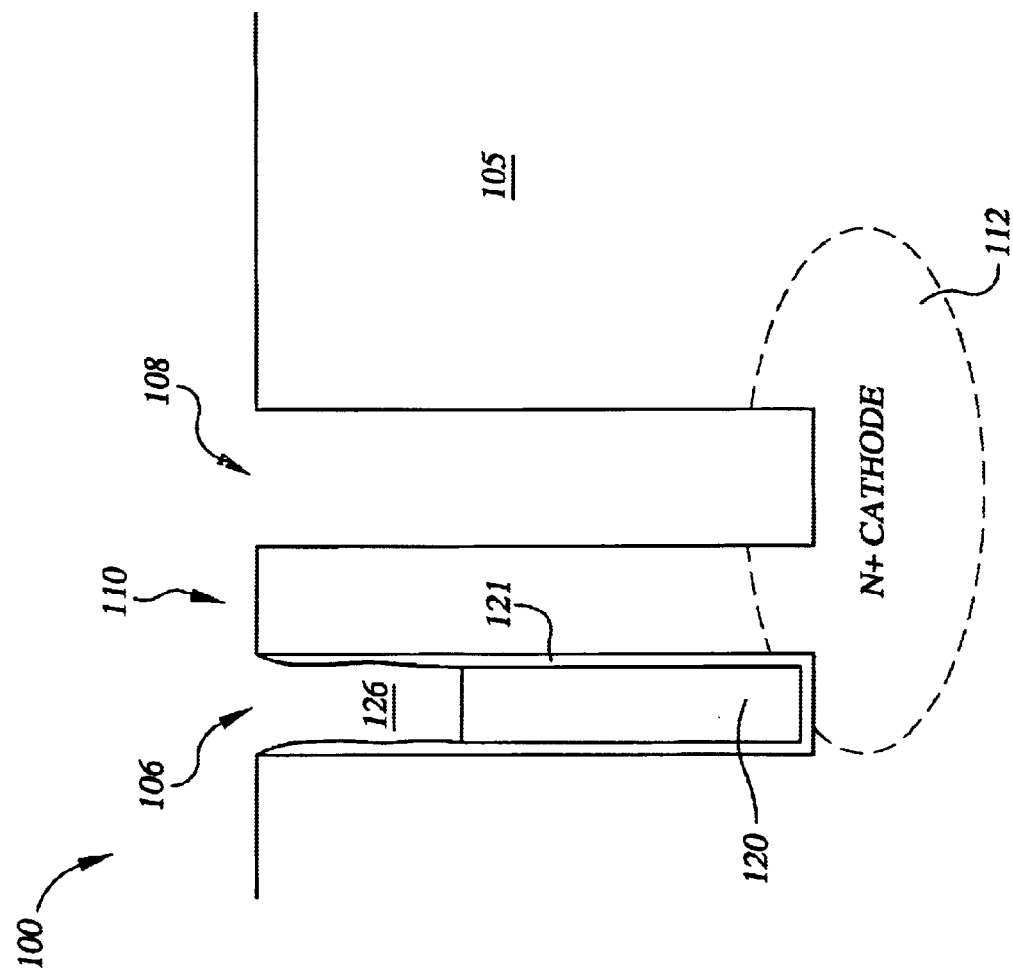

Turning now to FIG. 1B, a control port 120 is formed in the trench region 106 after the trench regions are etched. First, trench region 106 is lined with a dielectric 121 at bottom and sidewall portions of the trench. Conductive material (e.g., polysilicon) is then formed in the lined trench region 106 and insulative material is formed in the trench region and over the control port. The conductive material and the dielectric 121 are arranged such that the conductive material is capacitively coupled to the thyristor body region 110 via the dielectric when a voltage is applied thereto.

Figure 1C:
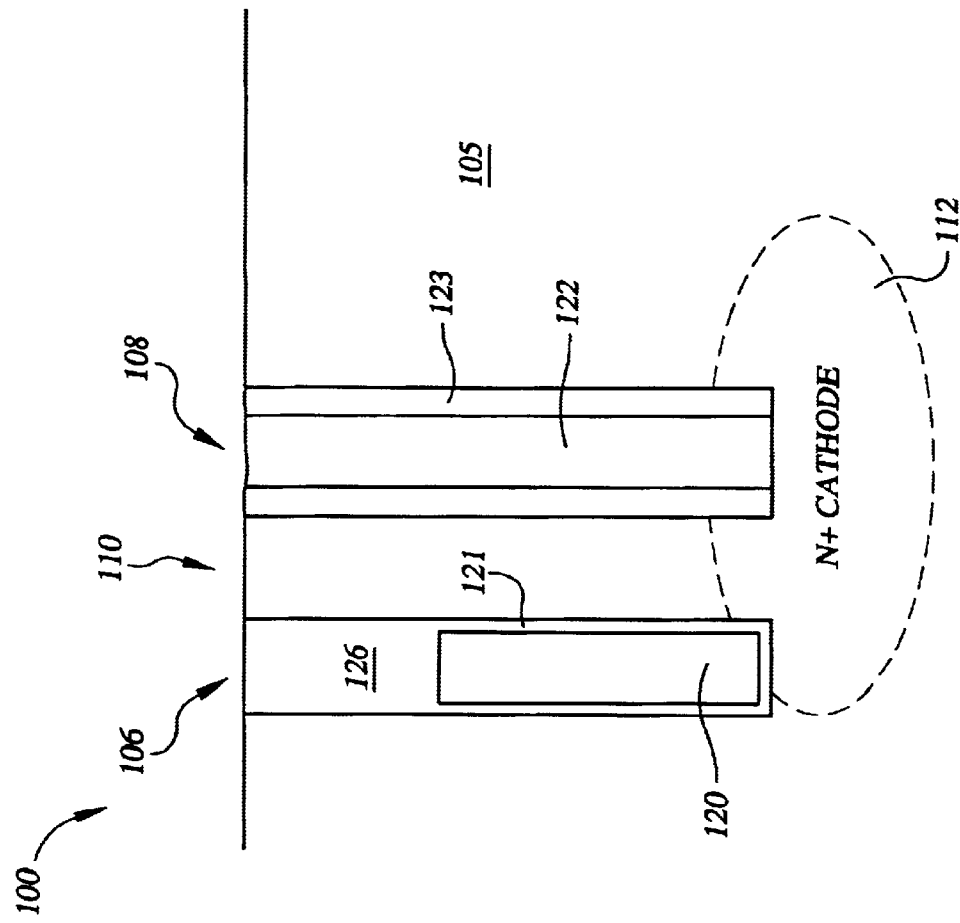

In FIG. 1C, a conductive shunt 122 is shown being formed in the trench region 108 and extending from the emitter region 112 to an upper portion of the substrate 105. If necessary, conductive material and/or dielectric material formed in the trench region 108 is removed prior to forming the conductive shunt. A portion of the trench region 108 is lined with an insulative spacer material 123, such as an oxide, forming a lined trench. In one implementation, the insulative spacer material 123 and the insulative material 126 are the same material and are formed in the same step. In another implementation, the insulative spacer material 123 and the dielectric 121 are the same material and are formed in the same step. Conductive material 108 is then formed in the lined trench, with any portion of the conductive material extending over the substrate 105 being subsequently etched. In one particular implementation, the control port 120 is formed around at least the thyristor region 110, and the insulative spacer material 123 is formed on a sidewall of the trench region where the control port is (e.g., as in the memory array discussed in connection with FIG. 2 below). In the implementation wherein the trench regions 106 and 108 are portions of the same trench, an insulative material is formed in the trench and between the control port and the conductive shunt, electrically insulating them from one another.

Figure 1D:
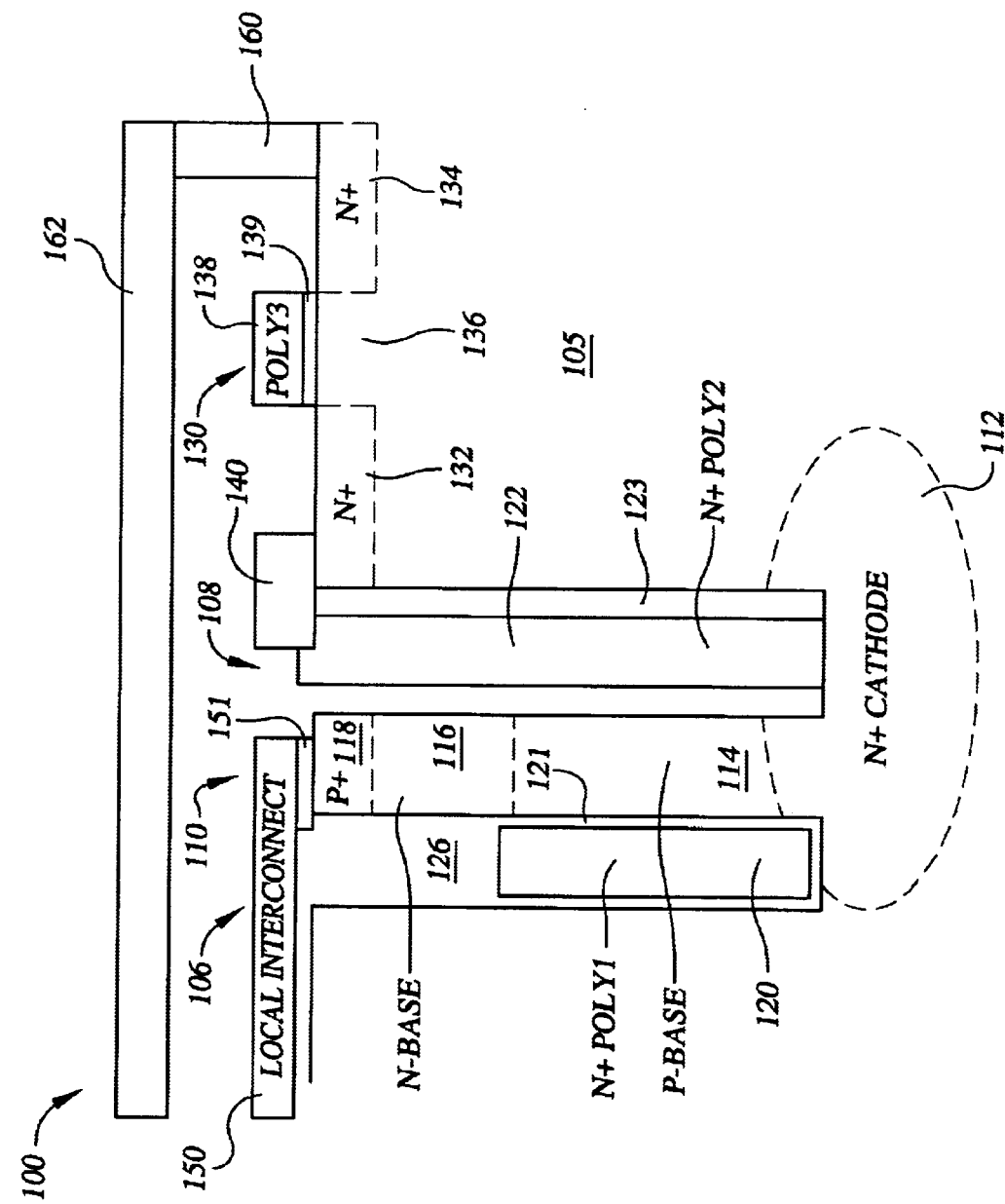

After the control port 120 and the conductive shunt 122 are formed, remaining portions of the device 100 are formed as shown in FIG. 1D. Thyristor body regions including P base region 114, N base region 116 and P+ anode emitter region 118 are implanted in the thyristor region 110. The P base region and the control port 120 are arranged such that the control port is capacitively coupled to the P base region 114 via the dielectric 121 when a voltage is applied thereto (e.g., using one or more voltage pulses). The capacitively coupled voltage is used for controlling current flow in the thyristor between the N+ cathode emitter 112 and the P+ anode emitter 118.

After the thyristor body regions are formed, pass device 130 is formed and electrically coupled in series with the N+ cathode emitter region 112. First, a dielectric 139 and a gate electrode material 138 (e.g., polysilicon) are deposited, patterned and etched over the substrate 105. The N+ source/drain regions 132 and 134 are then implanted in the substrate 105, separated by a channel region 136, using the gate electrode for alignment. The gate electrode is adapted to control current flow between the source/drain regions 132 and 134 in response to a voltage being applied thereto.

After the thyristor and the pass device are formed, they are electrically coupled to each other and to other circuitry. A contact region 151 is formed on the P+ anode emitter region 118, and interconnect 150 is electrically coupled to the contact region 151 and to other circuitry (not shown), such as a reference voltage line. Another contact 140 is formed bridging over the insulator 123 and electrically coupling the conductive shunt 122 with the N+ source/drain region 132, which couples the pass device 130 in series with the N+ cathode 112. The shunt 122 may, for example, be formed using N+ doped polysilicon, and thus doped similarly to the source/drain region 132 and the N+ cathode emitter region 112. A data output node (e.g., bit line contact) 160 is coupled to the N+ source/drain region 134 from a metal line 162 and is electrically coupled to the N+ cathode region 112 when the pass device 130 is in a current passing mode. In response to signals applied to the gate 138 and the control port 120, and using the shunt 122, the thyristor-based device 100 is adapted for writing data to and reading data from the N+ cathode emitter region 112 using an electrical connection through the pass device 130.

Figure 1E:
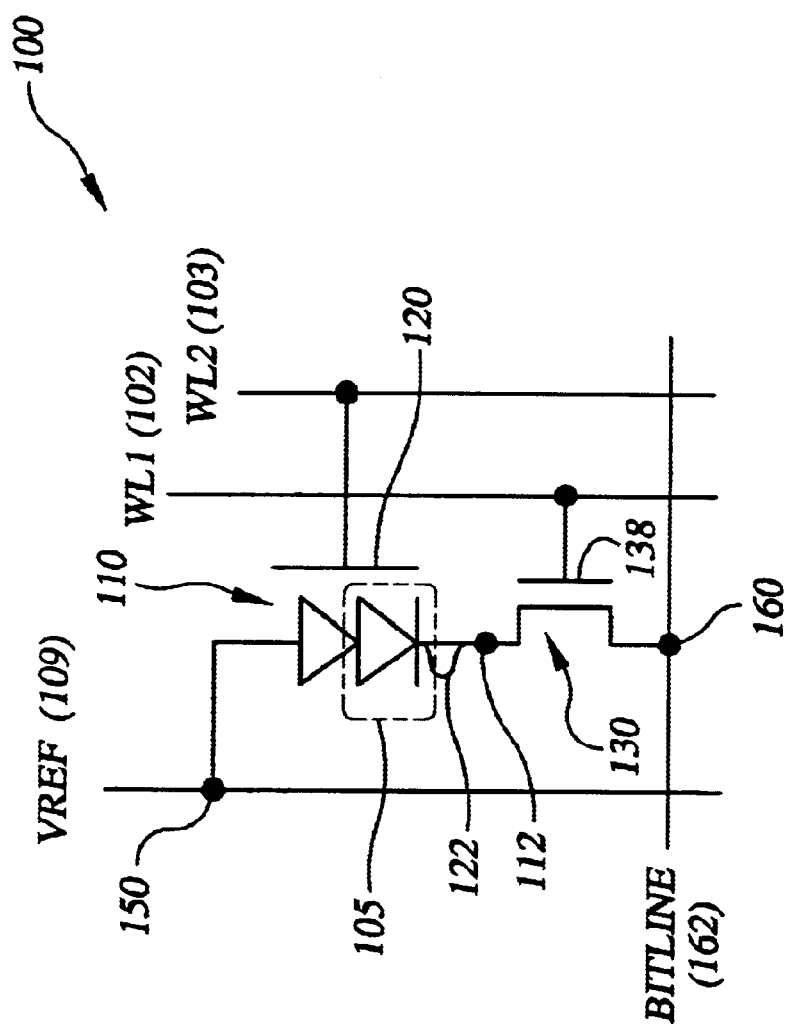
FIG. 1E is a circuit including a thyristor-based device, such as shown in FIG. 1D, according to another example embodiment of the present invention.

The present invention is applicable to a variety of devices and circuit arrangements. FIG. 1E is one such circuit arrangement 100, according to a more particular example embodiment of the present invention. The circuit arrangement 100 may include, for example, the circuit formed in FIGS. 1A–1D, and includes a thyristor body 110 and a pass device 130 (e.g., transistor) electrically coupled in series and adapted for storing data at a storage node 112. Control ports 120 and 138 are adapted for controlling current flow in the thyristor body 110 and the pass device 130, respectively, in response to signals applied to first (WL1) and second (WL2) word lines 102 and 103. A contact 150 is adapted to electrically couple a signal from a reference voltage (Vref) line 109 to an emitter region of the thyristor body region 110. In addition, data output node 160 is adapted to electrically couple a signal between a bit line 162 and a source/drain region of the pass device 130, for example, for reading data out from the data storage node 112. In response to signals applied to WL1 and WL2, and using signals at the bit line 162 and Vref line 109, the device 100 is adapted for writing data to and/or reading data from the storage node 112. The circuit arrangement includes a shunt connection 122 extending from a source/drain region of the pass device 130 to a buried emitter region of the thyristor body in a substrate 105, which is particularly useful in applications where a cathode-down arrangement of the thyristor is desired. For more information regarding data storage and manipulation with a thyristor-based device, such as the device 100, and in particular for controlling current in a thyristor-based device with a capacitively coupled control port, reference may be made to U.S. Pat. No. 6,229,161 (Nemati et al.), which is fully incorporated herein by reference.

Various ones of the example embodiments described below in connection with the figures share similar features with each other and with FIGS. 1A–1E. In each of these example embodiments, certain discussion of similar features that are similarly numbered is omitted for brevity.

In another example embodiment of the present invention, and referring again to FIGS. 1B–1C, the N+ cathode emitter region is formed using out-diffusion. More specifically, the N+ cathode implantation step described above is skipped, and the cathode shunt 122 is out-diffused to form the N+ cathode region shown in FIG. 1C. In one implementation, the out-diffusion occurs naturally and in another implementation, the thyristor-based semiconductor device 100 is exposed to conditions (e.g., heat) that cause species (e.g., dopant material) in the conductive shunt 122 to diffuse into the substrate 105 to form the N+ cathode 112.

Figure 2:
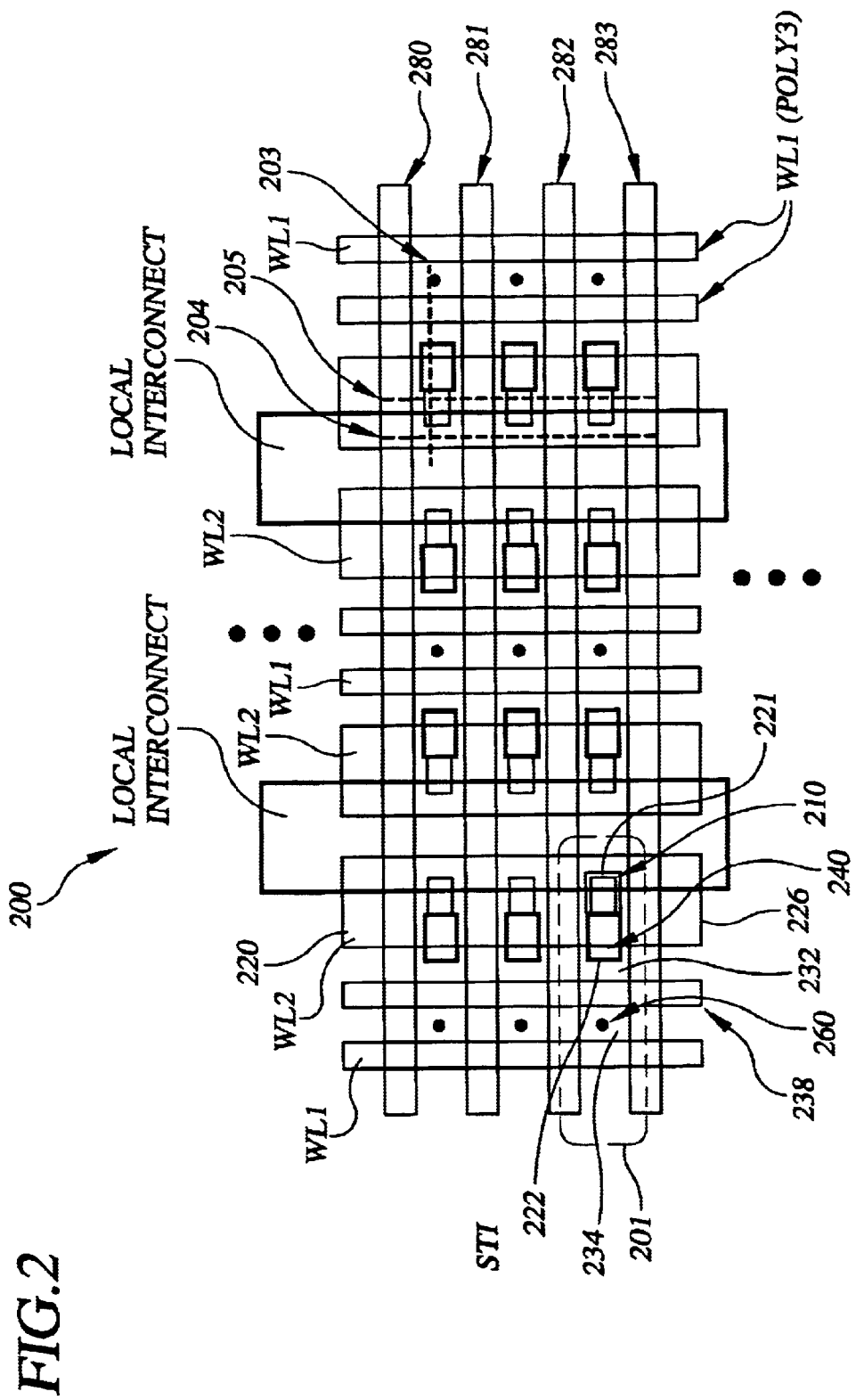
FIG. 2 is a memory array including a plurality of memory cells, each cell having a thyristor and a contact to an emitter region below an upper surface of a substrate, according to another example embodiment of the present invention.

FIG. 2 is a memory array having thyristor-based memory cells having a conductive shunt extending from a buried emitter region of a thyristor to a pass device, according to another example embodiment of the present invention. The memory array 200 may, for example, be formed using one or more of the methods described in connection with FIGS. 1A–1D and/or in connection with other example embodiments discussed herein. A variety of memory cells are in data-accessible groups and share word lines, bit lines and local interconnects (e.g., for electrically coupling to a reference voltage), as shown, wherein one or more of the memory cells is formed having a shunt contact to a buried thyristor emitter region. For instance, data-accessible groups extending in a first direction in the array may share word lines, while data-accessible groups extending in a second direction in the array may share bit lines.

Shallow trench isolation (STI) regions 280, 281, 282 and 283 are formed in a substrate and adapted to electrically isolate adjacent memory cells. In one particular implementation, the STI is used to form a deep trench that is adapted to isolate buried emitter regions of the thyristor-based devices. For more information regarding the use of an STI trench to isolate one or more portions of a thyristor and/or circuitry coupled thereto, reference may be made to U.S. patent application Ser. No. 10/262,758 (TRAM.019PA), filed concurrently herewith and entitled "Varied Trench Depth for Thyristor Isolation," which is fully incorporated herein by reference.

Referring to memory cell 201 as an example, a deep trench 226 is formed in a substrate, lined with a dielectric 221 and a control port (WL2) 220 is formed in a bottom portion of the deep trench and separated from a thyristor pillar 210 by the dielectric. However, it will be appreciated that WL2 can be implemented as in the above-referenced patent document entitled "Trench Isolation for Thyristor-based Device" (TRAM.014PA), in which WL2 is coupled to the upper base region. A thyristor emitter region (e.g., such as region 112 in FIG. 1A) is implanted via a bottom portion of the trench and below the thyristor pillar 210. A cathode shunt 240 is also formed in a deep trench and electrically coupled to the cathode emitter region. An insulative liner material 222 is formed on sidewalls of the cathode shunt 240 and electrically insulates the cathode shunt from other portions of the device, such as the control port 220.

After the cathode shunt 240 is formed, thyristor body regions are implanted in pillar 210, with the control port 220 being capacitively coupled to the body regions and adapted to control current flow in the thyristor pillar. A pass device is coupled in series to the cathode via the shunt 240 and includes source/drain regions 232 and 234 separated by a channel region below a first word line (WL1) 238. A bit line contact 260 electrically couples the source/drain region 234 to a metal 1 (M1) bit line.

Figure 3:
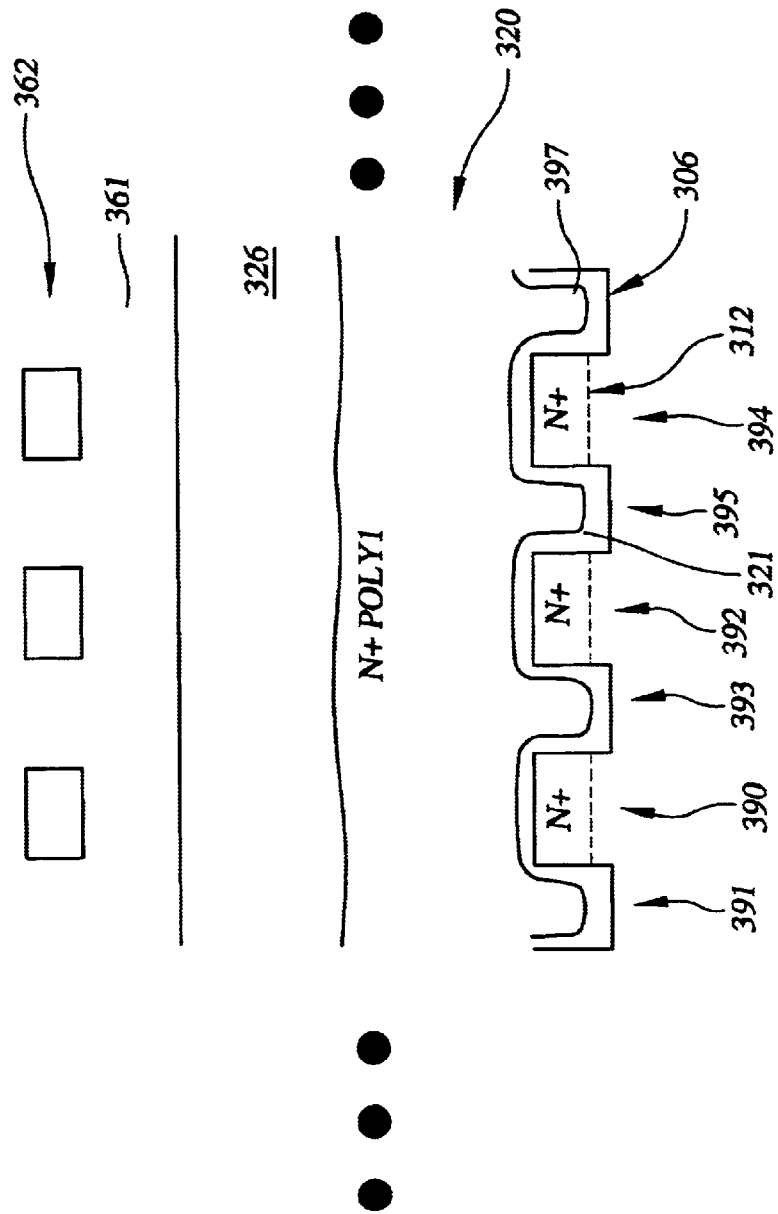
FIG. 3 is an example cross-section of memory cells the memory array of FIG. 2, according to another example embodiment of the present invention.
Figure 4:
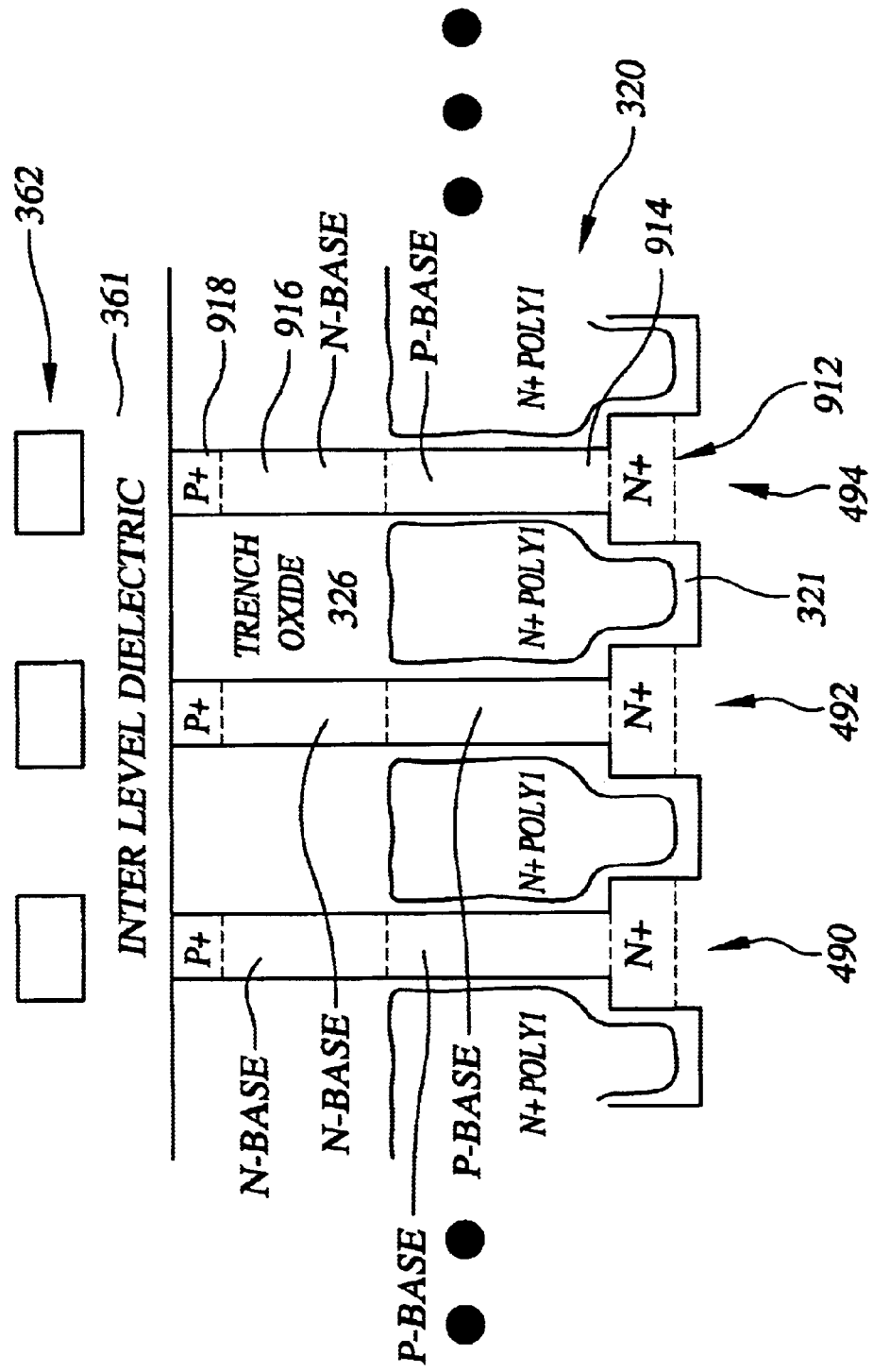
FIG. 4 is another example cross-section of memory cells in the memory array of FIG. 2, according to another example embodiment of the present invention.

The memory array can be implemented using one or more of a variety of memory cells, including those discussed herein. For example, cross-section A (203) may be implemented using the device shown in FIG. 1D, and cross-sections B (204) and C (205) may be implemented as shown in FIGS. 3 and 4, respectively. In addition, the array 200 may be extended as represented by the dotted lines in FIG. 2.

Referring now to FIG. 3 and viewing cross-section B of FIG. 2, WL2 320 is formed in a deep trench lined with an insulative material (e.g., a dielectric) 321, with WL2 320 forming a control port for three thyristor-based memory cells 390, 392 and 394. A shallow trench for STI is first etched, followed by a deep trench etch, which results in regions 391, 393, 395 and 397 being deeper below the etched shallow trench. N+ cathode regions 390, 392 and 394 are implanted through the bottom of another trench region (e.g., such as trench 108 shown in FIG. 1A), and the deeper regions are adapted to electrically isolate the adjacent N+ cathode regions. Each cathode emitter region is electrically coupled to a source/drain region of an adjacent pass device with a conductive shunt, such as shunt 240 shown in FIG. 2. N+ polyl material (e.g., a first deposited polysilicon that is subsequently doped) is near a bottom portion of the trench and forms a thyristor control port, and oxide 326 is formed over the N+ polyl material. The insulative liner material 321 electrically insulates the control port 320 from the N+ cathode regions.

Inter level dielectric 361 is formed over the thyristor regions and metal 1 bit lines (e.g., a first deposited conductive line), including bit line 362, are formed over the oxide material 326. The metal 1 bit lines are electrically coupled to a source/drain region of an adjacent pass device. Remaining portions of the memory cell, including thyristor body and pass device regions, are also formed in a manner not inconsistent with the present invention, and may include one or more aspects as shown in the other Figures. In addition, the memory cells may be extended laterally as shown by the dotted lines.

Referring to FIG. 4 in view of cross-section C of FIG. 2 and cross-section B in FIG. 3 as an example reference, thyristor body regions 490, 492 and 494 are shown having a P base region capacitively coupled to WL2 320 formed near a bottom of a deep trench. N+ cathode emitters of each thyristor are electrically coupled to a source/drain region of a pass device using a conductive shunt, such as shunt 240 shown in FIG. 2. WL2 is adapted to fill a lower portion of the deep trench in a manner that reduces the aspect ratio of the trench to be filled, making possible the filling of the upper portion of the trench with an oxide 326 (e.g., as shown in FIG. 1B). Using thyristor body region 494 as an example, the body is made up of N+ cathode emitter region 912 and implanted with P base region 914, N base region 916 and P+ anode emitter region 918. Inter level dielectric 361 and metal 1 bit lines 362 are formed over the body regions, and the bit lines are electrically coupled to a source/drain region of an adjacent pass device in series with the P+ emitter regions. As with FIG. 3, remaining portions of the memory cell are formed in a manner not inconsistent with the present invention, and may include one or more aspects as shown in the other figures. In addition, the memory cells may be extended laterally as shown by the dotted lines.

In one implementation, the insulative liner material 321 discussed above has a varied thickness, with a thicker portion thereof adjacent to the N+ cathode regions and a relatively thinner portion thereof adjacent to the P base region 914. The varied thickness facilitates the capacitive coupling of a voltage pulse from the control port 320 to the P base region 914, while insulating the control port from the N+ cathode region 912.

As an alternative approach, any of the above embodiments can be modified using the approach(es) illustrated and described in concurrently-filed U.S. Provisional Patent Application Serial No. 60/415,356 (TRAM.037P1), entitled "Novel Minority Carrier Isolation Device."

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors and shunts; forming portions of the device in different orders (e.g., blanket implanting the substrates to form base regions of the thyristors, prior to forming other structures, such as the control ports), adding structures to the integrated circuit device; increasing the number of PN sections in the thyristor; and interchanging P and N regions in the device structures and/or using PMOSFETS rather than NMOSFETS. In addition, for more information regarding implementations to which the present invention is applicable and detailed construction of example thin-capacitively-coupled thyristor and components thereof, reference may be made to U.S. Pat. No. 6,229,161, which is fully incorporated herein by reference. Such modifications and changes do not depart from the true spirit and scope of the present invention that is set forth in the claims.

What is claimed is:

1. A semiconductor device comprising:
   a substrate having an upper surface;
   a thyristor having a body and a control port, the body including an emitter region below the upper surface of the substrate and the control port being adapted for capacitively coupling to a portion of the thyristor body for controlling current flow therein; and
   a conductive shunt extending through a portion of the substrate and electrically coupling the emitter region to a node at the upper surface of the substrate.

2. The semiconductor device of claim 1, wherein the control port is configured and arranged for capacitively coupling to said portion of the thyristor body in response to at least one voltage pulse for causing an outflow of minority carriers therefrom.

3. The semiconductor device of claim 2, wherein the control port and the thyristor body are arranged such that the control port capacitively couples a signal that causes the outflow of minority carriers independently from any MOS-inversion channel formation.

4. The semiconductor device of claim 1, wherein the control port is disposed in a filled trench in the substrate and configured and arranged for capacitively coupling to said portion of the thyristor via a sidewall of the filled trench between the control port and the thyristor body.

5. A semiconductor device comprising:
   a substrate having an upper surface;
   a thyristor having a body and a control port adapted for capacitively coupling to the body for controlling current flow therein, the body including an emitter region below the upper surface of the substrate;
   a filled trench in the substrate and including the control port;
   a pass device; and
   a conductive shunt extending through a portion of the substrate and electrically coupling the emitter region in series with the pass device.

6. The semiconductor device of claim 5, wherein the pass device is configured and arranged for electrically coupling the emitter region to a bit line.

7. The semiconductor device of claim 6, wherein the pass device includes first and second source/drain regions separated by a channel region and a gate capacitively coupled to the channel region, and wherein the conductive shunt electrically couples the emitter region with the first source/drain region and wherein the second source/drain region is coupled to the bit line.

8. The semiconductor device of claim 5, wherein the conductive shunt includes doped polysilicon.

9. The semiconductor device of claim 5, wherein the conductive shunt includes metal.

10. The semiconductor device of claim 5, wherein the filled trench is lined with a dielectric on a sidewall of the filled trench that faces the thyristor body and wherein the control port is adapted for capacitively coupling to the body via the dielectric.

11. The semiconductor device of claim 5, wherein the conductive shunt is in a second filled trench in the substrate.

12. The semiconductor device of claim 11, wherein the thyristor body has at least two vertically-adjacent regions below the upper surface of the substrate, wherein the filled trench and the second filled trench are a single trench in the substrate, the single trench extending around at least a portion of the at least two vertically-adjacent thyristor body regions, the control port being in a first portion of the single trench and the conductive shunt being in a second portion of the single trench and electrically insulated from the control port by insulative material in the single trench.

13. The semiconductor device of claim 5, wherein the filled trench has a varied depth, with a deeper portion of the filled trench electrically insulating the emitter region from adjacent circuitry in the substrate.

14. The semiconductor device of claim 13, further including a shallow trench isolation (STI) region in the substrate and electrically insulating the pass device from other circuitry, wherein the deeper portion of the filled trench is below the STI region.

15. The semiconductor device of claim 14, further including a second thyristor and pass device coupled in series and adjacent to said thyristor and pass device, wherein the STI region is disposed laterally between said pass device and the second pass device and wherein the deeper portion of the filled trench electrically insulates the emitter regions of said thyristor and the second thyristor.

16. A semiconductor device comprising:
   a substrate having a trench region and an upper surface;
   a thyristor having a body and a control port, the body having first and second end portions, the first end portion including an emitter region and a base region in the substrate and below the upper surface, the second end portion including a base region and an emitter region, the base regions of the first and second end portions being coupled to one another, the control port being in the trench region and configured and arranged for capacitively coupling to the base region of the first end portion for controlling current flow in the thyristor in response to a voltage pulse applied to the control port;
   a reference voltage line coupled to the emitter region of the second end portion and adapted for applying a reference voltage thereto;
   a conductive shunt in the trench region, separated from the control port by an insulative liner and extending from a node at the upper surface to a node at the emitter region in the substrate; and
   a transistor having first and second source/drain regions and a gate, the source/drain regions being adjacent to the upper surface of the substrate and separated by a channel region in the substrate, the gate being over the channel region adapted for controlling current flow between the source/drain regions, the first source/drain region further being electrically coupled to the emitter region of the first end portion via the conductive shunt at the node at the upper surface.

17. The semiconductor device of claim 16, further including an output circuit having an output node, wherein the second source/drain region is coupled to the output node, and the transistor is adapted for electrically coupling the output node to the emitter region of the first end portion via the conductive shunt in response to a voltage pulse applied to the gate.

18. The semiconductor device of claim 16, further including a data output circuit having a data output node, wherein the second source/drain region is coupled to the data output node, and the transistor is adapted for electrically coupling the data output node to the emitter region of the first end portion via the conductive shunt in response to a voltage pulse applied to the to the gate.

19. The semiconductor device of claim 18, wherein the data output circuit is a data storage circuit.

20. The semiconductor device of claim 19, wherein the data output node is connected to a bit line.

21. A semiconductor device comprising:
   a reference voltage line;
   a substrate having an upper surface;
   a plurality of memory cells arranged in an array in data-accessible groups each group including data storage circuits with each of said data storage circuits having respective data output nodes connected to a common bit line; and
   each of the memory cells including:
      a trench region in the substrate;
      a thyristor having a body and a control port, the body having first and second end portions, the first end portion including an emitter region and a base region in the substrate and below the upper surface, the second end portion including a base region and an emitter region;
      the emitter region of the second end portion being coupled to the reference voltage line;
      the base regions of the first and second end portions being coupled to one another;
      the control port being in the trench region and configured and arranged for capacitively coupling to the base region of the first end portion for controlling current flow in the thyristor in response to a voltage pulse applied to the control port;
      a conductive shunt in the trench region, separated from the control port by an insulative liner and extending from a node at the upper surface to a node at the emitter region of the first end portion; and
      a transistor having first and second source/drain regions and a gate, the source/drain regions being adjacent to the upper surface of the substrate and separated by a channel region in the substrate, the gate being over the channel region adapted for controlling current flow between the source/drain regions, the first source/drain region further being electrically coupled to the emitter region the first end portion via the conductive shunt at the node at the upper surface.

* * * * *

UNITED STATES PATENT AND TRADEMARK OFFICE
CERTIFICATE OF CORRECTION

PATENT NO. : 6,666,481 B1  Page 1 of 1
DATED : December 23, 2003
INVENTOR(S) : Horch et al.

It is certified that error appears in the above-identified patent and that said Letters Patent is hereby corrected as shown below:

Title page,
Item [56], References Cited, OTHER PUBLICATIONS,
"6/98, Nemati, Farid, and Plummer, James D., "A Novel High Density, Low Voltage SRAM Cell with a Vertical NDR Device", VLSI Technology Technical Digest."
should read
-- Nemati, Farid, and Plummer, James D., "A Novel High Density, Low Voltage SRAM Cell with a Vertical NDR Device", VLSI Technology Technical Digest, 6/98. --

"1999, Nemati, Farid, and Plummer James, D., "A Novel Thyristor-based SRAM Cell (T-RAM) for High-Speed, Voltage, Giga-scale Memories", International Electron Device Meeting Technical Digest." should read
-- Nemati, Farid, and Plummer James D., "A Novel Thyristor-based SRAM Cell (T-RAM) for High-Speed, Voltage, Giga-scale Memories", International Electron Device Meeting Technical Digest, 1999 --

"Gribnikov, Z.S., Korobov, V.A., and Mitin, V.V., "The Tunnel Diode As A Thyristor Emitter", Solid-State Electronics, vol. 42, No. 9, pp. 1761-1763." should read
-- Gribnikov, Z.S. Korobov, V.A. and Mitin, V.V., "The Tunnel Diode As A Thyristor Emitter", Solid-State Electronics, vol. 42, No. 9, pp. 1761-1763, 1998. --

Column 1,
Line 35, "peeds" should read -- speeds --.

Signed and Sealed this

Ninth Day of November, 2004

JON W. DUDAS
*Director of the United States Patent and Trademark Office*